(12) United States Patent
Pindl et al.

(10) Patent No.: US 10,950,765 B2
(45) Date of Patent: Mar. 16, 2021

(54) METHOD FOR PRODUCING AT LEAST ONE OPTOELECTRONIC COMPONENT, AND OPTOELECTRONIC COMPONENT

(71) Applicant: OSRAM Opto Semiconductors GmbH, Regensburg (DE)

(72) Inventors: Markus Pindl, Tegernheim (DE); Markus Burger, Laaber (DE); Markus Boss, Regensburg (DE); Matthias Lermer, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/491,146

(22) PCT Filed: Mar. 6, 2018

(86) PCT No.: PCT/EP2018/055459
§ 371 (c)(1),
(2) Date: Sep. 4, 2019

(87) PCT Pub. No.: WO2018/162470
PCT Pub. Date: Sep. 13, 2018

(65) Prior Publication Data
US 2020/0075818 A1    Mar. 5, 2020

(30) Foreign Application Priority Data
Mar. 8, 2017   (DE) .................... 10 2017 104 851.0

(51) Int. Cl.
*H01L 33/50* (2010.01)
*H01L 33/54* (2010.01)
(Continued)

(52) U.S. Cl.
CPC .............. *H01L 33/54* (2013.01); *H01L 33/50* (2013.01); *H01L 33/56* (2013.01);
(Continued)

(58) Field of Classification Search
CPC ......... H01L 33/50; H01L 33/56; H01L 33/54; H01L 33/0095; H01L 2933/0033; H01L 2933/005
See application file for complete search history.

(56) References Cited

U.S. PATENT DOCUMENTS 9,293,671 B2    3/2016  Brunner et al.
10,217,913 B2 *  2/2019  Pindl ................... H01L 33/0095
(Continued)

FOREIGN PATENT DOCUMENTS

DE  102010028407 A1  11/2011
DE  102011078906 A1   1/2013
(Continued)

*Primary Examiner* — Nikolay K Yushin
(74) *Attorney, Agent, or Firm* — Slater Matsil, LLP

(57) ABSTRACT

A method for producing at at least an optoelectronic component and an optoelectronic component are disclosed. In an embodiment a method includes providing a substrate having at least one aperture, applying at least one semiconductor chip to the substrate, arranging barrier structures provided that the barrier structures are not already part of the substrate, wherein the semiconductor chip is spaced apart from the barrier structures as seen in a side cross-section, applying an auxiliary carrier at least to a main radiation exit surface and to the barrier structures, introducing a casting material via the at least one aperture in the substrate so that the casting material is arranged between the barrier structures and the semiconductor chip and between the substrate and the auxiliary carrier, and curing the casting material.

18 Claims, 6 Drawing Sheets

(51) Int. Cl.
*H01L 33/56* (2010.01)
*H01L 33/00* (2010.01)
(52) U.S. Cl.
CPC .... *H01L 33/0095* (2013.01); *H01L 2933/005* (2013.01); *H01L 2933/0033* (2013.01)

(56) References Cited

U.S. PATENT DOCUMENTS

| | | | |
|---|---|---|---|
| 2005/0239227 A1 | 10/2005 | Aanegola et al. | |
| 2008/0290359 A1* | 11/2008 | Inoue | B29O 39/42 257/98 |
| 2009/0230409 A1 | 9/2009 | Basin et al. | |
| 2013/0113010 A1* | 5/2013 | Brunner | H01L 33/005 257/98 |
| 2016/0293812 A1* | 10/2016 | Pindl | H01L 33/0095 |

FOREIGN PATENT DOCUMENTS

| | | |
|---|---|---|
| DE | 102012109144 A1 | 4/2014 |
| DE | 102015112969 A1 | 2/2017 |

\* cited by examiner

METHOD FOR PRODUCING AT LEAST ONE OPTOELECTRONIC COMPONENT, AND OPTOELECTRONIC COMPONENT

This patent application is a national phase filing under section 371 of PCT/EP2018/055459, filed Mar. 6, 2018, which claims the priority of German patent application 102017104851.0, filed Mar. 8, 2017, each of which is incorporated herein by reference in its entirety.

TECHNICAL FIELD

The invention concerns a method for manufacturing at least one optoelectronic device. Furthermore, the invention concerns an optoelectronic device.

SUMMARY OF THE INVENTION

Embodiments provide a method for manufacturing at least one optoelectronic device that allows easy manufacturing of the optoelectronic device. Further embodiments provide a cost-effective optoelectronic device.

In at least one embodiment, the method for manufacturing at least one optoelectronic device comprises the steps of: A) providing a substrate having at least one aperture, B) applying at least one semiconductor chip to the substrate, wherein the at least one semiconductor chip has a main radiation exit surface which is arranged facing away from the substrate, C) arranging barrier structures, provided that the barrier structures are not already part of the substrate, wherein the semiconductor chip is arranged spaced apart between the barrier structures as seen in the side cross-section, D) applying an auxiliary carrier at least to the main radiation exit surface and to the barrier structures, E) introducing a casting material via the at least one aperture of the substrate so that the casting material is arranged at least between the barrier structures and the semiconductor chip and between the substrate and the auxiliary carrier, wherein the main radiation exit surface is free of the casting material, F) curing of the casting material, and if necessary G) removing the auxiliary carrier so that the casting material and the main radiation exit surface are arranged in one plane as seen in the side cross-section.

The inventors have discovered that the method described here can provide an optoelectronic device that can be easily filled with a casting material, in particular a highly reflective casting material, so that the side surfaces of the semiconductor chip are covered by the casting material and only the main radiation exit surface, i.e., the light-emitting surface of the semiconductor chip, remains free of the casting material.

Currently, methods are typically used, such as film assisted molding (FAM), in which the main radiation exit surface of the semiconductor chip is completely overmolded and back-grinding must then take place. In addition, only hard elements can be molded into these conventional technologies. The inventors have recognized that by using the method described here, overmolding and grinding can be dispensed with.

According to at least one embodiment, the method comprises a step A), providing a substrate having at least one aperture. The substrate may, for example, be a ceramic, a printed circuit board or, in general, a plate formed with a plastic material, a metal, a ceramic material or a semi-finished material. The substrate can also be a PCB (Printed Circuit Board). The substrate has at least one aperture. In particular, the substrate has more than one aperture, for example two, three, four, five, six apertures. The apertures in the substrate are apertures that completely penetrate the substrate. In other words, in step E) the casting material can be injected or introduced through these apertures.

According to at least one embodiment, the substrate has at least two apertures, whereby the first aperture is used for step E) and/or the second aperture is used for venting at least during step E).

According to at least one embodiment, air escapes via the second aperture so that air bubbles in the casting material are reduced or avoided.

According to at least one embodiment, the substrate has a first type of aperture through which step E) takes place and a second type of aperture through which venting takes place. First or second type of apertures here means that the apertures of one type have the same function or task that is different from the other type. In other words, more than one aperture can be used for the insertion of the casting material and also more than one aperture can be used for venting.

According to at least one embodiment, the at least one aperture has an elongated or round shape. The aperture can, for example, have the shape of a slot or a round aperture through which the casting material is introduced by means of a needle. In principle, other forms of aperture are also conceivable, such as a cross-shaped shape.

According to at least one embodiment, the method comprises a step B), applying at least one semiconductor chip to the substrate. The at least one semiconductor chip has a main radiation exit surface. The main radiation exit surface is arranged facing away from the substrate.

That a layer or element is placed or applied "on top of" or "above" another layer or element may mean here and in the following that one layer or element is placed or applied directly in mechanical and/or electrical contact with the other layer or element. Furthermore, it can also mean that one layer or element is arranged indirectly on or above the other layer or element. Further layers and/or elements can then be arranged between one and the other layer or between one and the other element.

According to at least one embodiment, the semiconductor chip has a semiconductor layer sequence. The semiconductor layer sequence of the semiconductor chip is preferably based on a III-V compound semiconductor material. For example, the semiconductor material is a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$, wherein respectively $0 \leq n \leq 1$, $0 \leq m \leq 1$ and $n+m \leq 1$. The semiconductor layer sequence may contain dopants as well as additional components. For the sake of simplicity, however, only the essential components of the crystal lattice of the semiconductor layer sequence, i.e., Al, As, Ga, In, N or P, are given, even if these may be partially replaced and/or supplemented by small quantities of other substances.

The semiconductor layer sequence comprises an active layer with at least one pn junction and/or with one or more quantum well structures. During operation of the semiconductor chip, electromagnetic radiation is generated in the active layer. The semiconductor chip is therefore set up during operation to emit radiation. A wavelength or maximum wavelength of the radiation is preferably in the ultraviolet and/or visible spectral range, particularly at wavelengths between 420 nm and 680 nm inclusive, for example, between 440 nm and 480 nm.

The optoelectronic device is in particular a light-emitting diode, or LED for short. The semiconductor chip is preferably designed to emit blue light.

According to at least one embodiment, the semiconductor chip is a flip chip. This means here and in the following that the semiconductor chip has all its electrical contacts arranged on one side. In particular, the contacts are then arranged between the semiconductor chip and the substrate. Such semiconductor chips have the advantage that no additional electrical contacts, for example, in the form of bonding wires, are required for the electrical connection.

In particular, the optoelectronic device has a conversion element, the conversion element being arranged directly downstream of the semiconductor layer sequence. "Directly" here means that no further layers or elements are applied between the conversion element and the semiconductor layer sequence. Alternatively, the conversion element can also be directly downstream of the semiconductor layer sequence. In this case, for example, an adhesive layer can be arranged between the conversion element and the semiconductor layer sequence. The conversion element is preferably designed to convert radiation of one wavelength into radiation of another, usually longer, wavelength during operation. The conversion element is particularly characterized by conversion materials, such as garnets, orthosilicates and nitrides, which are embedded in a matrix material, for example. Alternatively, the conversion element can also be shaped as a ceramic so that the conversion element substantially consists of the conversion materials. Here "substantially" means that, apart from minor impurities, the conversion element is formed exclusively from the conversion material.

According to at least one embodiment, the semiconductor chip has a glass plate, the glass plate being directly downstream of the semiconductor layer sequence. Alternatively, the glass plate is arranged immediately after the semiconductor layer sequence, with an adhesive layer, for example, being arranged between the glass plate and the semiconductor layer sequence. The glass plate can, for example, be shaped as a lens. Alternatively or additionally the glass plate can also serve as a spacer.

The semiconductor chip has a main radiation exit surface. At least a large part of the radiation generated by the semiconductor layer sequence is emitted via the main radiation exit surface. The main radiation exit surface is perpendicular to the growth direction of the semiconductor layer sequence. The main radiation exit surface is arranged facing away from the substrate.

According to at least one embodiment, the method has a step C) comprising arranging barrier structures. Step C) can also be omitted if the barrier structures are already part of the substrate. In other words, the substrate may have elevations at the edges that form the barrier structures. The at least one semiconductor chip or a plurality of semiconductor chips are arranged at a distance between the barrier structures as seen in the side cross-section. "Arranged at a distance" here means that there is a lateral distance between the barrier structures and the side surfaces of the semiconductor chip, i.e., the semiconductor chips are not directly adjacent to the barrier structures.

According to at least one embodiment, the barrier structures are frame-like in plan view of the optoelectronic device. Thus, when performing step E), the casting material cannot overflow the side edges of the substrate.

According to at least one embodiment, the barrier structures in the side cross-section have the same height as the height of the semiconductor chip. In particular, the height of the semiconductor chip refers to the height of the semiconductor layer sequence and the height of the conversion material or glass plate.

According to at least one embodiment, the barrier structures have an elongated shape, i.e. a slot, the width of the slot being at least 200 µm to 300 µm and ≤1 mm. The width of the slot is preferably between 200 µm and 1 mm inclusive.

The barrier structures can be arranged in step C). Alternatively, the barrier structures can also be part of the substrate, so that step C) can be omitted. The barrier structures limit the cavity of the casting material.

The barrier structures can also be one barrier structure here and in the following, especially if, seen from above, the barrier structure is in the form of a dam or a frame.

According to at least one embodiment, the method comprises a step D) of applying an auxiliary carrier at least to the main radiation exit surface and to the barrier structures. Preferably the auxiliary carrier is a foil. The foil can have a layer thickness between 50 µm and 100 µm, for example, between 60 µm and 80 µmm. The foil can, for example, be made of polyamide.

According to at least one embodiment, the auxiliary carrier is flexibly formed. Alternatively, the auxiliary carrier can also be rigid. The auxiliary carrier can be glued or laminated onto the main radiation exit surface of the semiconductor chip or onto the main radiation exit surfaces of a plurality of semiconductor chips. This prevents the casting material from reaching the main radiation exit surface in the later method step E), i.e., when introducing a casting material. The main radiation exit surface thus remains free of the casting material.

According to at least one embodiment, the auxiliary carrier has an adhesive layer. The adhesive layer is arranged between the main radiation exit surface and the auxiliary carrier. In particular, the adhesive layer is arranged directly downstream of at least one main radiation exit surface. This prevents the casting material from being arranged on the main radiation exit surface in step E).

The adhesive layer may contain an adhesive such as acrylate or silicone.

The adhesive layer is preferably applied to the entire surface of the auxiliary carrier.

According to at least one embodiment, the method comprises a step E) of introducing a casting material via the at least one aperture of the substrate so that the casting material is arranged at least between the barrier structures and the semiconductor chip and between the substrate and the auxiliary carrier, the main radiation exit surface being free of the casting material.

According to at least one embodiment, step E) is carried out by means of a needle dosing method or jetting.

The inventors have found out that by inserting the casting material on the reverse side via the apertures in the substrate, it is possible to dispense with back-grinding, for example, in a so-called molding process.

According to at least one embodiment, the auxiliary carrier, the barrier structures and the substrate form a frame in which the casting material is placed, when viewed from the side cross-section. The casting material can be dosed in via the apertures in this frame and distributed between the substrate, the semiconductor chip and the auxiliary carrier by the capillary effect of the gap. Preferably at least one aperture has the function of a venting, whereby the air, which was previously arranged in the frame of substrate, barrier structures and auxiliary carrier, can escape from the device. Preferably, this space within the frame is completely filled with the casting material.

According to at least one embodiment, the method has a step F) comprising curing of the casting material. The curing can be carried out at elevated temperatures of more than 100° C. The casting material can be silicone or epoxy, for example.

According to at least one embodiment, the casting material has reflective particles. The reflective particles are especially arranged to have a reflection of >90%, >95% or 99%. The casting material and the reflective particles preferably form the housing of the device after step F). The housing may have a surface facing away from the substrate and planar to the main radiation exit surface.

The reflective particles are formed from titanium dioxide, aluminum oxide, aluminum nitride, silicon dioxide or zirconium dioxide according to at least one embodiment. Preferably the reflective particles are titanium dioxide. The reflective particles can be homogeneously distributed in the casting material. Alternatively, the reflective particles in the casting material may have a concentration gradient.

According to at least one embodiment, the casting material is silicone or epoxy.

According to at least one embodiment, the casting material is silicone and the reflective particles are titanium dioxide. Polydimethylsiloxane (PDMS) or a polydialkylarylsiloxane, such as polymethylphenylsiloxane, or polydiphenylsiloxane can be used as silicone.

The dosing in step E) of a highly reflective casting material can be carried out from the back of the substrate through the apertures according to an embodiment. The material is distributed primarily by the capillary action of the gap or aperture between the auxiliary carrier, which is in particular a laminated foil, and the substrate. The dosing and venting apertures can be designed or formed in such a way that no air inclusions occur during filling.

The curing of the casting material can also take place in an autoclave under vacuum. This allows the air bubbles in the casting material to be reduced or completely avoided.

According to at least one embodiment, the method comprises a step G) of removing the auxiliary carrier so that the casting material and the main radiation exit surface are arranged in one plane as seen in the side cross-section. Step G) can be optional. In other words, the auxiliary carrier may also be present in a finished optoelectronic device. This is particularly the case if the auxiliary carrier assumes a filter or spreading function, for example.

The auxiliary carrier can be removed by machine or by hand, for example. Preferably a foil is used here as an auxiliary carrier. The foil can then be removed. Alternatively, a conveyor belt with a highly adhesive foil can be used to remove the auxiliary carrier.

According to at least one embodiment, the method comprises an additional step H), wherein the arrangement produced in step D) is rotated so that the substrate is arranged over the semiconductor chip in the opposite direction to the direction of gravity.

In other words, this method step H) can preferably take place before step E), so that the substrate is now arranged in the opposite direction to gravity. In the side cross-section, the substrate is thus arranged above the auxiliary carrier and above the semiconductor chip. Step E) can thus be carried out from above, so that the casting material can be introduced through the apertures in the substrate and can, for example, be distributed within and between the semiconductor chips or between the semiconductor chip and the barrier structures due to the capillary effect and/or gravity of the casting material. At least after the casting material has been inserted, the arrangement can be turned back again.

Preferably, the area between the barrier structures and the semiconductor chips or between adjacent semiconductor chips is completely filled with the casting material. The result is a planar plane in which the main radiation exit surface and the surface of the cured casting material are arranged. In other words, the main radiation exit surface is seen in the side cross-section and the casting material is arranged at a height.

According to at least one embodiment, the method has a plurality of semiconductor chips. The semiconductor chips are arranged on the substrate. Preferably, the semiconductor chips are arranged in matrix form in plan view of the substrate. The semiconductor chips are arranged at a distance between the barrier structures as seen from the side cross-section, with the auxiliary carrier extending over the barrier structures and the main radiation exit surfaces of the respective semiconductor chips. In step E), the casting material is placed between the barrier structures and the semiconductor chips and between adjacent semiconductor chips, whereby after step F), the semiconductor chips are singulated. Singulation can be carried out, for example, by sawing or by means of a laser. The semiconductor chips are therefore framed by the casting material.

According to at least one embodiment, method steps B) and C) can also be reversed. The method steps specified here do not necessarily have to be carried out in the sequence A to G. Preferably; however, the method steps are carried out in the order given in claim 1.

The invention also concerns an optoelectronic device. The optoelectronic device is preferably manufactured using the method described herein. All embodiments and definitions of the method also apply to the optoelectronic device and vice versa.

The inventors have recognized that the method described herein can provide an optoelectronic device with a flat or planar component surface. In addition, light-resistant silicones can be used as casting material. By sticking the auxiliary carrier, in particular a foil, the conversion elements can be reliably kept free of the casting material. This makes it possible to use soft conversion elements, especially dimensionally unstable conversion elements. In addition, the casting material in which, for example, reflective particles are embedded, has a high degree of reflection, especially if the reflective particles are titanium dioxide. The method can therefore dispense with molding processes.

BRIEF DESCRIPTION OF THE DRAWINGS

Further advantages, embodiments and developments of the invention can be derived from the exemplary embodiments described in the following in connection with the figures.

In the figures.

In the exemplary embodiments and figures, identical, similar or similarly acting elements can each be provided with the same reference signs. The elements shown and their proportions are not to be regarded as true to scale. Rather, individual elements, such as layers, components, devices and areas, can be displayed in an exaggeratedly large format for better representability and/or better understanding.

DETAILED DESCRIPTION OF ILLUSTRATIVE EMBODIMENTS

FIGS. 1A to 8B show a method for the manufacturing of at least one optoelectronic device according to one embodiment, here using the example of eight devices arranged in a matrix. The respective Figures XA with X=1 to 8 show the side cross-section of the respective method stage and the respective Figures XB with X=1 to 8 show a plan view of the respective method step.

Figure 1A:
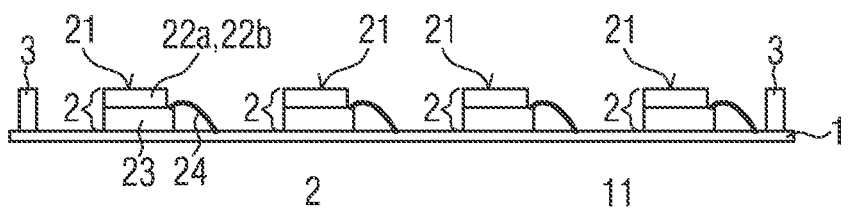
FIGS. 1A to 8B show a method for manufacturing an optoelectronic device according to an embodiment.
Figure 1B:
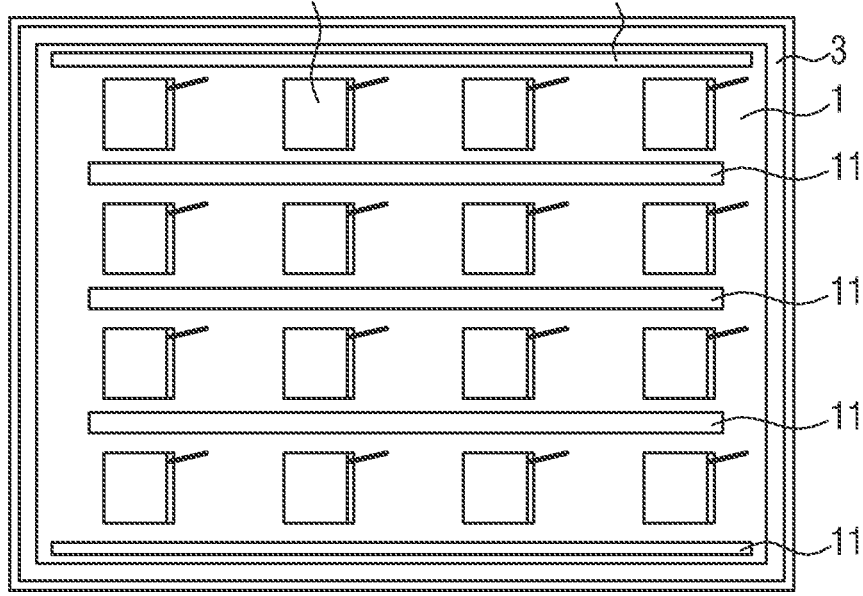

FIGS. 1A and 1B show the provision of a substrate 1. The substrate 1 has at least one aperture 11, preferably several apertures. At least one semiconductor chip 2, here sixteen semiconductor chips 2, is applied to substrate 1. The semiconductor chips 2 each have a semiconductor layer sequence 23 and a conversion element 22a or a glass plate 22b. In addition, the semiconductor chips 2 each have a bonding wire 24. Alternatively, other semiconductor chips 2 can also be used here, for example, a so-called flip chip. The at least one semiconductor chip 2 has a main radiation exit surface 21. In addition, barrier structures 3 are arranged on the substrate 1, as seen in the side cross-section. Alternatively, the barrier structures 3 can already be part of substrate 1. The barrier structures 3 can also only be one barrier structure which, as here, is arranged in a frame on the substrate so that an overflow over the edges of substrate 1 is avoided when the casting material is later introduced.

Figure 2A:
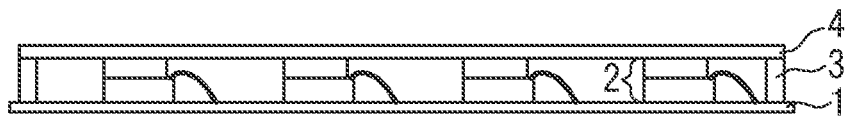
Figure 2B:
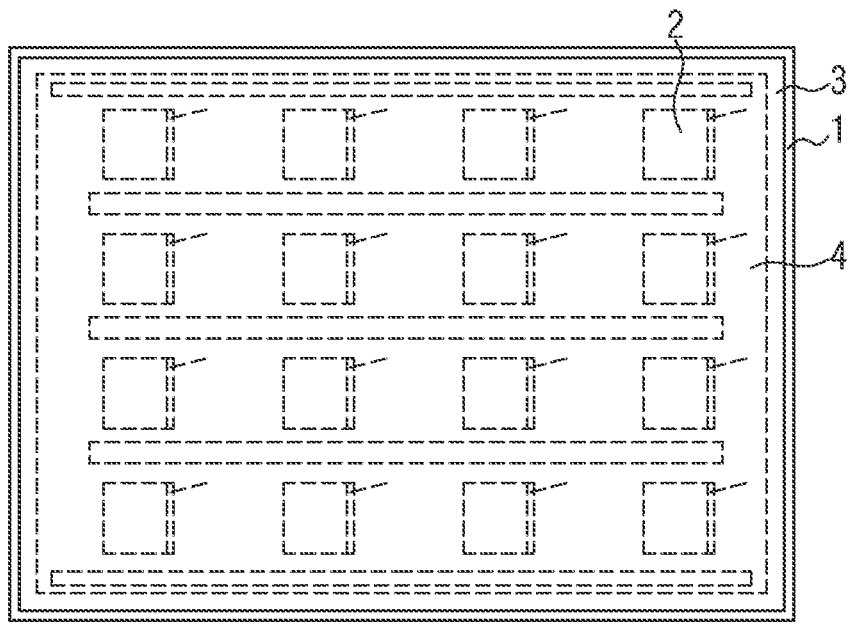

FIGS. 2A and 2B show the application of an auxiliary carrier 4 at least to the respective main radiation exit surfaces of the semiconductor chips 2 and to the barrier structures 3. The auxiliary carrier 4 preferably closes materially and form-fittingly with the barrier structures 3, so that a tight frame can be produced between barrier structures 3, auxiliary carrier 4 and substrate 1 as seen in the side cross-section and the casting material is not introduced to overflow over the side edges of the substrate 1 or over the regions between barrier structures 3 and auxiliary carrier 4 (overlapping regions). Auxiliary carrier 4 can be a foil laminated with an adhesive layer. Preferably the foil is flexibly formed.

Figure 3A:
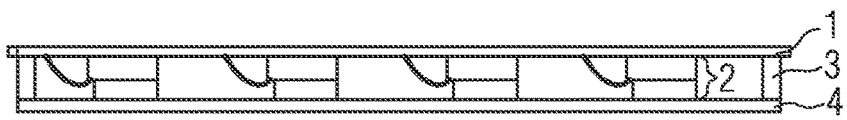
Figure 3B:
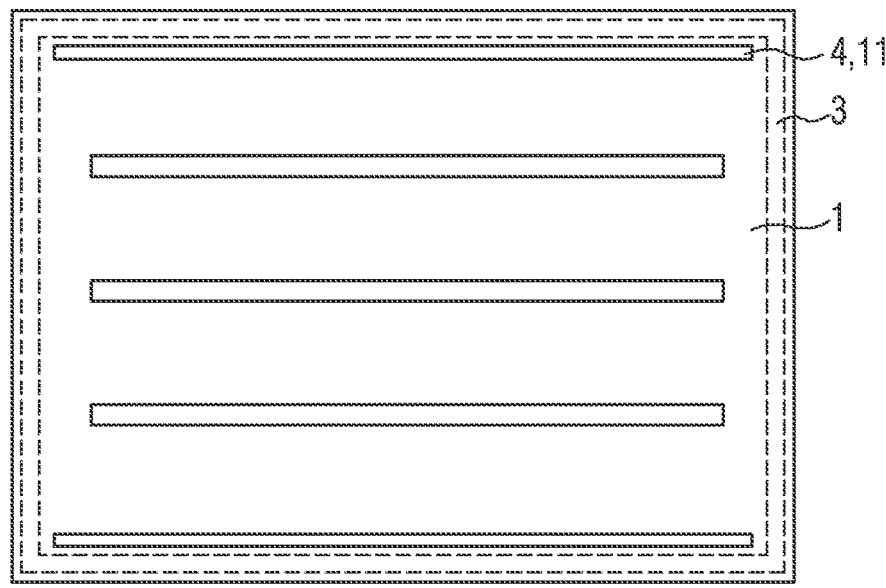

Subsequently, as shown in FIGS. 3A and 3B, the arrangement produced in FIGS. 2A and B can optionally be rotated so that, seen in the side cross-section, the auxiliary carrier 4 is arranged below the substrate 1. This allows easy filling with casting material 5 via the back of substrate 1 from above. In this example, the apertures 11 are elongated. Alternatively, the apertures 11 can also have a round or cross shape. If the auxiliary carrier 4 is flexibly formed, it can be machined using vacuum so that it has a planar surface.

Figure 4A:
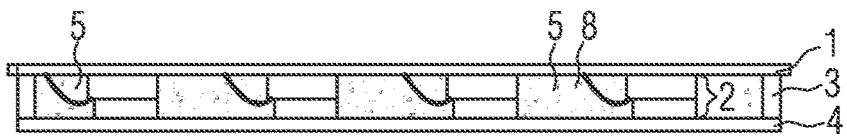
Figure 4B:
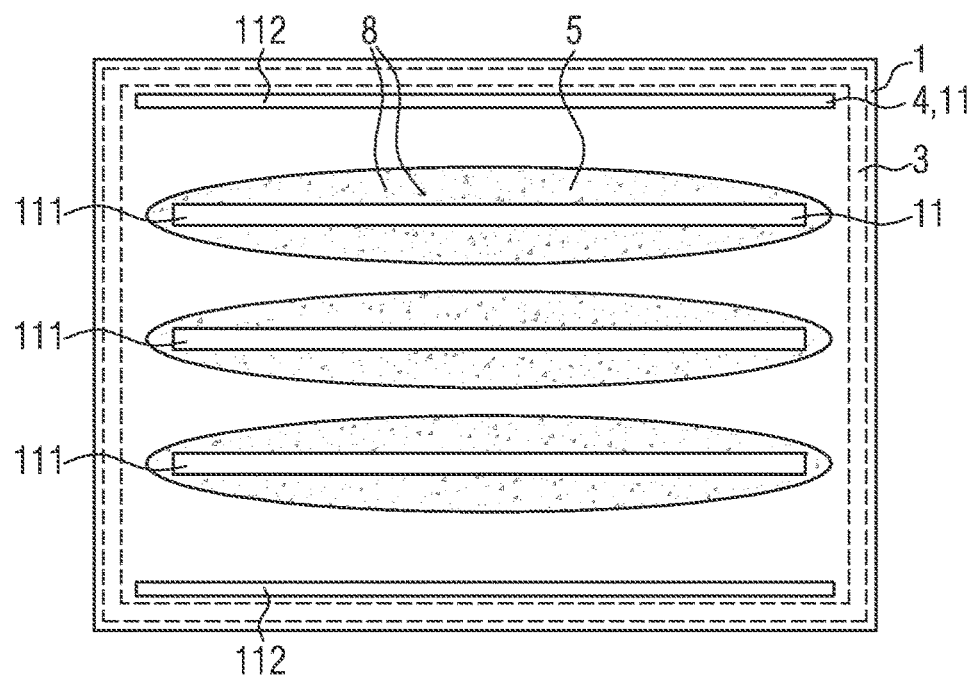

In the following step, as shown in FIGS. 4A and 4B, the casting material 5 can be applied to substrate 1. In particular, the casting material 5 has reflective particles 8, such as titanium dioxide. The casting material 5 can be silicone, for example. Due to the capillary effect of the apertures 111, the casting material 5 can get between substrate 1, semiconductor chip 2 and auxiliary carrier 4. In addition, air can escape from device 100 through apertures 112. The casting material 5 is arranged at least between the barrier structures 3 and the semiconductor chip 2 and, if necessary, between adjacent semiconductor chips 2. Furthermore, the casting material 5 is arranged between the substrate 1 and the auxiliary carrier 4. Substrate 1 can have different types of apertures 11. The substrate can have 111 apertures, also called first apertures, which are used to introduce the casting material 5. In addition, the substrate may have second apertures 112 which serve as venting.

Figure 5A:
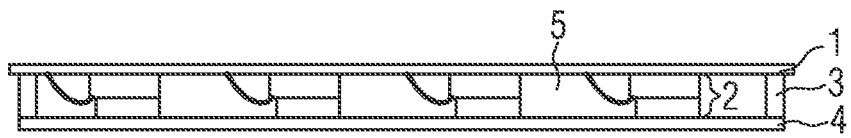
Figure 5B:
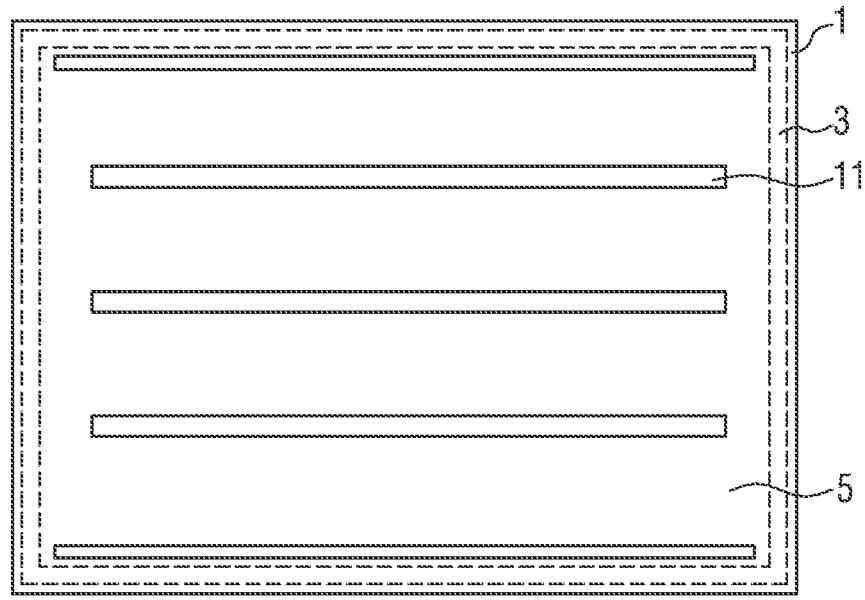

Subsequently, as shown in FIGS. 5A and 5B, the space between auxiliary carrier 4, substrate 1 and barrier structures 3 can be completely filled with the casting material.

Subsequently, method step F) can be carried out so that the casting material 5 is cured and thus maintains its dimensional stability. Air bubbles can be avoided by using an autoclave or vacuum.

Figure 6A:
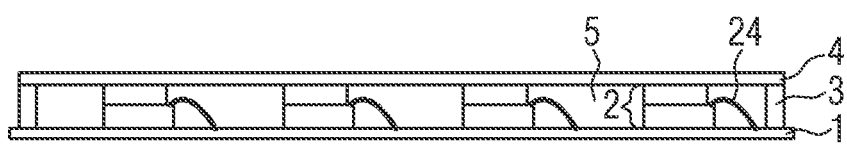
Figure 6B:
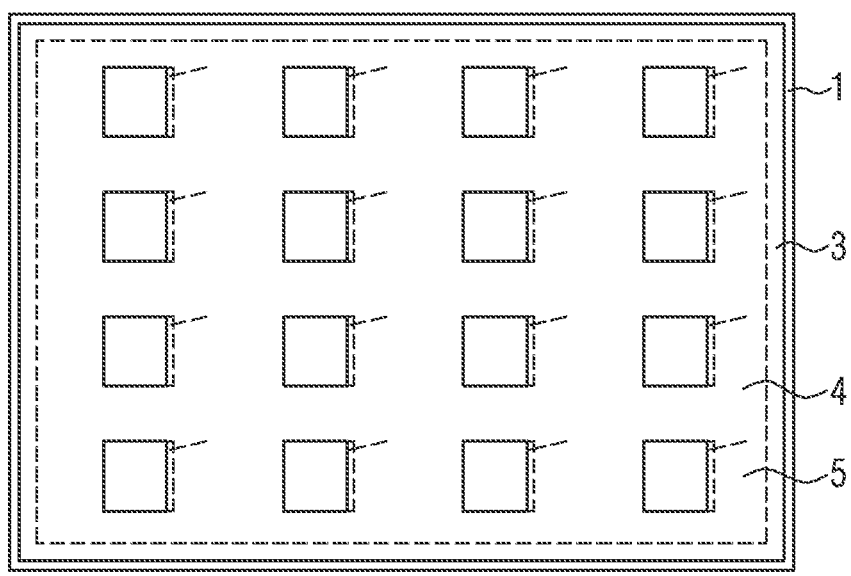

Then, as shown in FIGS. 6A and 6B, the arrangement can optionally be rotated again. Thus the arrangement of FIGS. 6A and 6B in the side cross-section and in the radiation direction of the emitting radiation of the semiconductor chip 2 shows the following sequence: substrate 1, semiconductor chip 2 and auxiliary carrier 4.

Figure 7A:
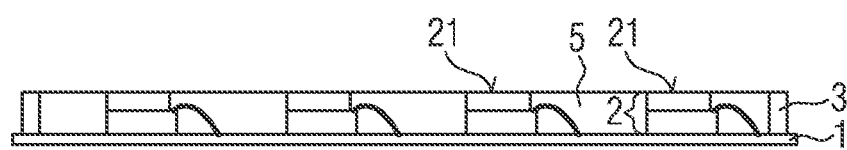
Figure 7B:
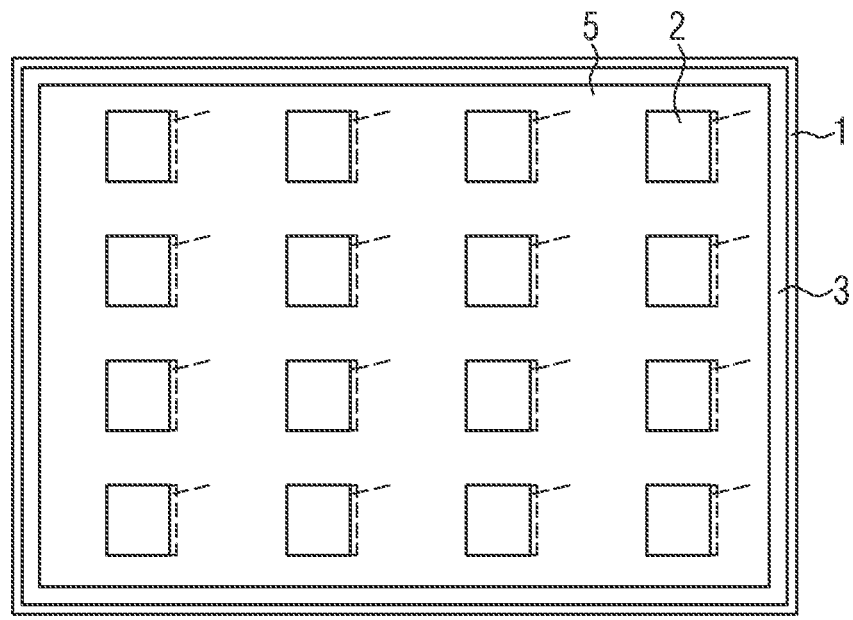

FIGS. 7A and 7B show the optional step G), that the auxiliary carrier 4 can be removed again. Preferably the auxiliary carrier 4 is removed again. If the auxiliary carrier 4 is a foil, it can be removed by machine or by hand. Thus the casting material 5 and the main radiation exit surface 21 have a planar embodiment seen in the side cross-section. In other words, the main radiation exit surface 21 and the surface of the casting material 91 are arranged in one plane.

This makes it possible to provide a device 100 that has a flat component surface without the need for subsequent grinding.

Figure 8A:
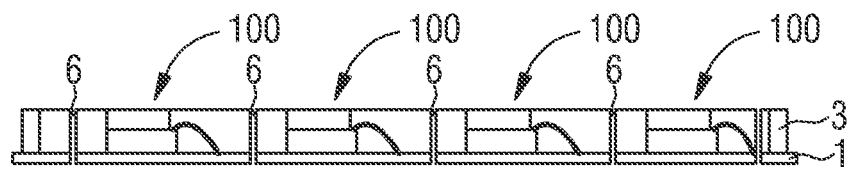
Figure 8B:
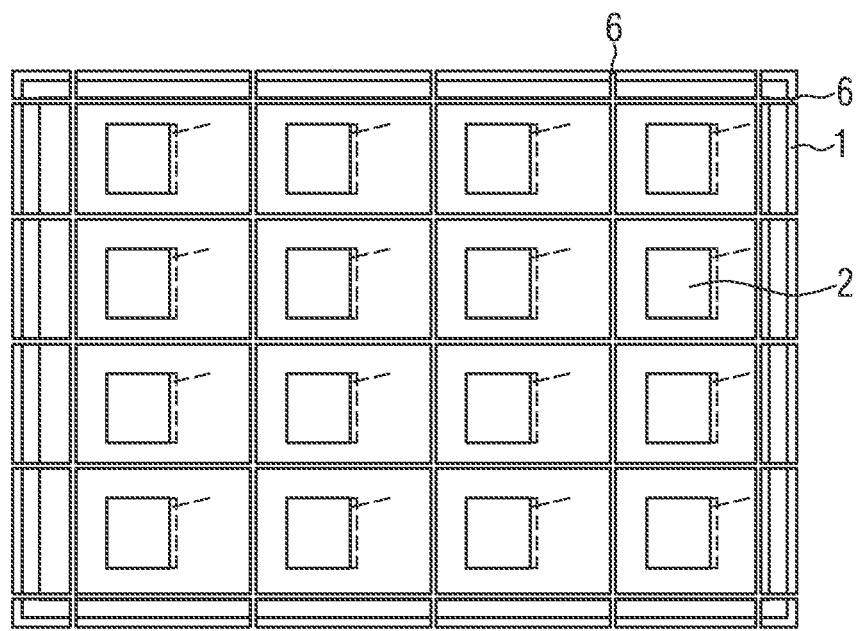

FIGS. 8A and 8B show the singulation of semiconductor chips 2 so that a plurality of optoelectronic devices 100 can be produced.

Figure 11:
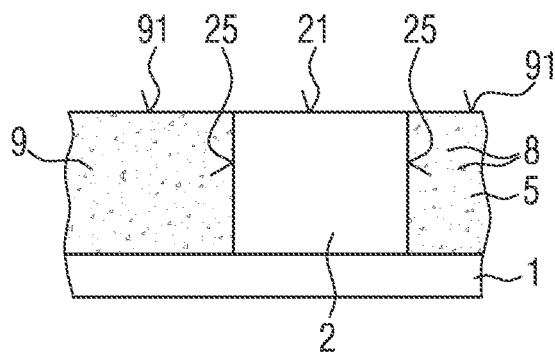
FIG. 11 shows a schematic side view of an optoelectronic device in accordance with an embodiment.

The optoelectronic devices 100 can have the embodiment shown in FIG. 11. For example, the optoelectronic device 100 has a ceramic substrate 1. A semiconductor chip 2 is arranged on substrate 1. The side surfaces 25 of the semiconductor chip are surrounded by a housing 9 that is material- and form-fitting. The housing 9 features the cured casting material 5, in which reflective particles 8, such as titanium dioxide, are embedded. Due to the manufacturing method, the main radiation exit surface 21 and the surface of the housing 91 are in one plane. The main radiation exit surface 21 is free of the casting material 5. Thus, the radiation generated in the semiconductor chip 2 can be completely decoupled via the main radiation exit surface 21. The radiation emitted via the side surfaces 25 is reflected by the housing and can be decoupled via the main radiation exit surface 21 on the device 100.

Figure 9:
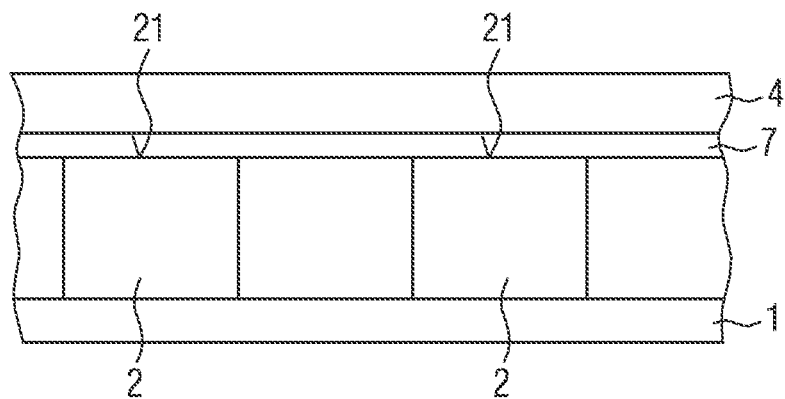
FIG. 9 shows a schematic side view of an arrangement produced with the method.

FIG. 9 shows a schematic side view of an arrangement produced during the method. The arrangement has a substrate 1 on which a plurality of semiconductor chips 2 are arranged, in this case two semiconductor chips 2. An auxiliary carrier 4 is arranged above the semiconductor chips 2. An adhesive layer 7, e.g., made of silicone, is arranged between the auxiliary carrier 4 and the main radiation exit surfaces 21 of the semiconductor chips 2. This allows better adhesion between the main radiation exit surfaces 21 and the auxiliary carrier 4.

Figure 10A:
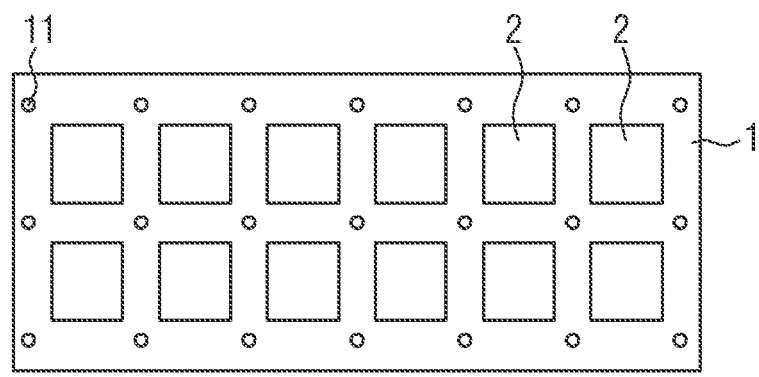
FIGS. 10A and 10B show schematic plan views of an arrangement produced herein during the method.
Figure 10B:
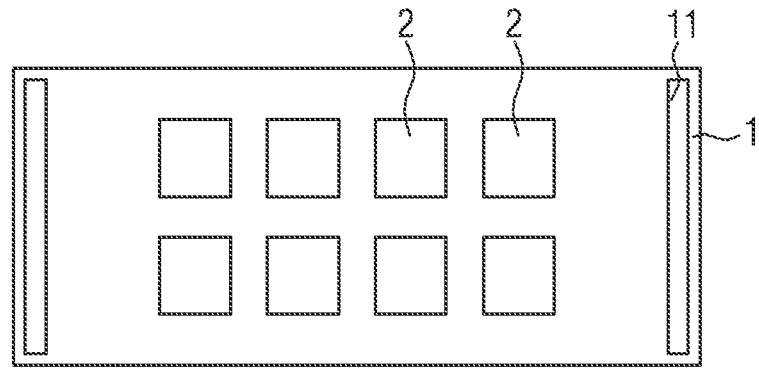

FIGS. 10A and 10B show a plan view of an arrangement produced during the method. The arrangement here shows the embodiment of the apertures 11. In the example of FIG. 10A, the apertures 11 are round so that, for example, the casting material can easily be introduced via the apertures using a needle dosing method.

FIG. 10B shows the embodiment of the apertures 11 as slots arranged between semiconductor chips 2 and barrier structures 3 (not shown here). In the subsequent singulation method the parts where the apertures 11 are located can be singulated.

The exemplary embodiments and their characteristics described in connection with the figures can also be combined with each other according to further exemplary embodiments, even if such combinations are not explicitly shown in the figures. Furthermore, the exemplary embodiments described in connection with the figures may have additional or alternative features as described in the general part.

The invention is not limited by the description of the exemplary embodiments. Rather, the invention includes any new feature and any combination of features, which in particular includes any combination of features in the patent claims, even if that feature or combination itself is not explicitly mentioned in the patent claims or in the exemplary embodiments.

The invention claimed is:

1. A method comprising:
providing a substrate having at least one aperture;
applying at least one semiconductor chip to the substrate, the semiconductor chip having a main radiation exit surface facing away from the substrate;
arranging barrier structures provided that the barrier structures are not already part of the substrate, wherein the semiconductor chip is spaced apart from the barrier structures as seen in a side cross-section;
applying an auxiliary carrier at least to the main radiation exit surface and to the barrier structures, wherein the auxiliary carrier is a foil;
rotating an arrangement after applying the auxiliary carrier so that the substrate is located above the semiconductor chip in an opposite direction to a direction of gravity;
introducing a casting material via the at least one aperture in the substrate so that the casting material is arranged between the barrier structures and the semiconductor chip and between the substrate and the auxiliary carrier, the main radiation exit surface being free of the casting material; and
curing the casting material.

2. The method according to claim 1, further comprising removing the auxiliary carrier so that the casting material and the main radiation exit surface are arranged in one plane as seen in the side cross-section.

3. The method according to claim 1,
wherein applying at least one semiconductor chip to the substrate comprises applying a plurality of semiconductor chips in matrix form to the substrate, the semiconductor chips being arranged at a distance from the barrier structures as seen in the side cross-section,
wherein the auxiliary carrier extends over the barrier structures and the main radiation exit surfaces of the semiconductor chips,
wherein the casting material is arranged between the barrier structures and the semiconductor chips and between adjacent semiconductor chips, and
wherein, after curing the casting material, singulating the semiconductor chips.

4. The method according to claim 1, wherein the auxiliary carrier has an adhesive layer, and wherein the adhesive layer is arranged directly on the main radiation exit surface so that a deposition of the casting material on the main radiation exit surface is prevented.

5. The method according to claim 1, wherein the at least one aperture has an elongate or round shape.

6. The method according to claim 1, wherein introducing the casting material via the at least one aperture comprises performing a needle dosing method or jetting.

7. The method according to claim 1, wherein the auxiliary carrier has a thickness between 60 μm and 80 μm inclusive.

8. The method according to claim 1, wherein the semiconductor chip comprises a semiconductor layer sequence for emitting radiation during operation and a conversion element, the conversion element being arranged directly downstream of the semiconductor layer sequence.

9. The method according to claim 1, wherein the semiconductor chip has a semiconductor layer sequence for emitting radiation during operation, and a glass plate, the glass plate being arranged directly downstream of the semiconductor layer sequence.

10. The method according to claim 1, wherein the casting material is silicone or epoxy.

11. An optoelectronic device obtainable by the method according to claim 1.

12. The method according to claim 1, wherein the casting material comprises reflective particles, and wherein the casting material forms a housing of a device after curing the casting material, the housing having a surface planar to the main radiation exit surface.

13. The method according to claim 12, wherein the reflective particles are formed of titanium dioxide, aluminum oxide, aluminum nitride, silicon dioxide or zirconia.

14. A method comprising:
providing a substrate having at least one aperture;
applying at least one semiconductor chip to the substrate, the semiconductor chip having a main radiation exit surface facing away from the substrate;
arranging barrier structures provided that the barrier structures are not already part of the substrate, wherein the semiconductor chip is spaced apart from the barrier structures as seen in a side cross-section;
applying an auxiliary carrier at least to the main radiation exit surface and to the barrier structures, wherein the auxiliary carrier is a foil;
introducing a casting material via the at least one aperture in the substrate so that the casting material is arranged between the barrier structures and the semiconductor chip and between the substrate and the auxiliary carrier, the main radiation exit surface being free of the casting material, wherein introducing the casting material via the at least one aperture comprises introducing the casting material via a first aperture while venting via a second aperture; and
curing the casting material.

15. The method according to claim 14, wherein air escapes via the second aperture so that air bubbles are avoided in the casting material.

16. The method according to claim 14, wherein the semiconductor chip comprises a semiconductor layer sequence for emitting radiation during operation and a conversion element, the conversion element being arranged directly downstream of the semiconductor layer sequence.

17. The method according to claim 14, wherein the semiconductor chip has a semiconductor layer sequence for emitting radiation during operation, and a glass plate, the glass plate being arranged directly downstream of the semiconductor layer sequence.

18. A method comprising:
providing a substrate having at least one aperture;
applying at least one semiconductor chip to the substrate, the semiconductor chip having a main radiation exit surface facing away from the substrate;
arranging barrier structures provided that the barrier structures are not already part of the substrate, wherein the semiconductor chip is spaced apart from the barrier structures as seen in a side cross-section, and wherein the barrier structures have the same height in the side cross-section as a height of the semiconductor chip;

applying an auxiliary carrier at least to the main radiation exit surface and to the barrier structures, wherein the auxiliary carrier is a foil;

introducing a casting material via the at least one aperture in the substrate so that the casting material is arranged between the barrier structures and the semiconductor chip and between the substrate and the auxiliary carrier, the main radiation exit surface being free of the casting material; and curing the casting material.

* * * * *